United States Patent [19]
Garvin et al.

[11] 3,988,564
[45] Oct. 26, 1976

[54] ION BEAM MICROMACHINING METHOD

[75] Inventors: Hugh L. Garvin, Malibu; Hayden M. Leedy, Thousand Oaks; Richard S. Iwasaki, Los Angeles, all of Calif.

[73] Assignee: Hughes Aircraft Company, Culver City, Calif.

[22] Filed: June 14, 1974

[21] Appl. No.: 479,686

Related U.S. Application Data

[63] Continuation of Ser. No. 272,518, July 17, 1972, abandoned.

[52] U.S. Cl............................. 219/121 EM; 29/578
[51] Int. Cl.²......................................... B23K 15/00
[58] Field of Search............... 219/121 EB, 121 EM, 219/121 R; 250/423, 426, 427, 492; 29/578; 204/129.1, 129.2, 129.3, 129.35, 129.46, 129.55, 129.65; 269/321 WE

[56] References Cited
UNITED STATES PATENTS

| | | | |
|---|---|---|---|
| 3,056,881 | 10/1962 | Schwartz................... | 219/121 EM X |
| 3,140,379 | 7/1964 | Schleich et al. ........... | 219/69 |
| 3,236,994 | 2/1966 | Kodera et al. ............ | 219/121 EM X |
| 3,340,377 | 9/1967 | Okazaki et al............ | 219/121 EM X |
| 3,480,755 | 11/1969 | Beesley et al................ | 219/121 EB |
| 3,534,385 | 10/1970 | Castaing et al. .............. | 219/121 EB |
| 3,583,361 | 6/1971 | Laudel, Jr.................. | 219/121 EB X |
| 3,840,721 | 10/1974 | Monk.............................. | 219/121 EB |
| 3,860,783 | 1/1975 | Schmidt et al................ | 219/121 EM |

FOREIGN PATENTS OR APPLICATIONS

| | | | |
|---|---|---|---|
| 451,332 | 5/1968 | Switzerland.................... | 219/121 EB |

Primary Examiner—Arthur T. Grimley
Assistant Examiner—G. R. Peterson
Attorney, Agent, or Firm—Lewis B. Sternfels; W. H. MacAllister

[57] ABSTRACT

Millimeter-wave electronic devices are produced first by micromachining an epitaxial layer on a substrate wafer to a precise thickness by directing an ion beam over the epitaxial layer. Any bombardment damage is removed by a light chemical etch. Thereafter, an insulative layer with a mask is placed over the micromachined epitaxial layer and the ion beam is broadly directed onto the masked wafer to micromachine precise holes through unmasked portions of the insulative layer. Micromachining may proceed until approximately 500 Å thickness of the insulative layer remains, this remaining layer being removed by a brief chemical etch to expose the underlying epitaxial layer. Alternatively, in cases where a slight recess into the semiconductor is desired to alter the electric field lines at the interface between the oxide and the semiconductor, the ion beam may be permitted to etch completely through the oxide film and into the epitaxial layer to the desired depth. Precise thinning of the epitaxial layer is obtained by holding the wafer down by a metallic tab which serves to retain and act as a shield against sputtering by the normally incident ion beam. Following removal of the desired layer thickness, the wafer is removed from the system and the amount of the material which was removed is verified by measuring the step height produced at the edge of the masking tab. Removal of additional material may be required and the wafer may be reinserted into the system with the same masking retainer tab.

3 Claims, 13 Drawing Figures

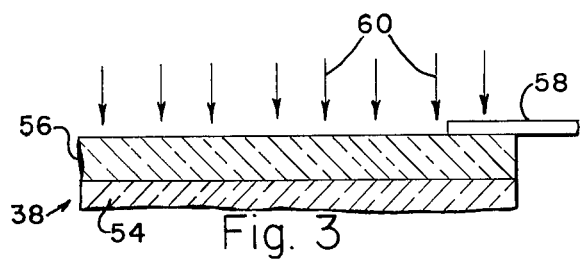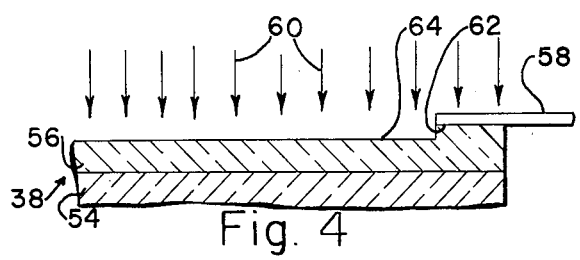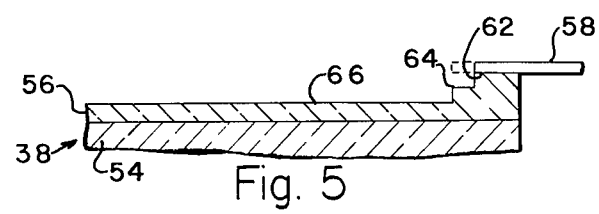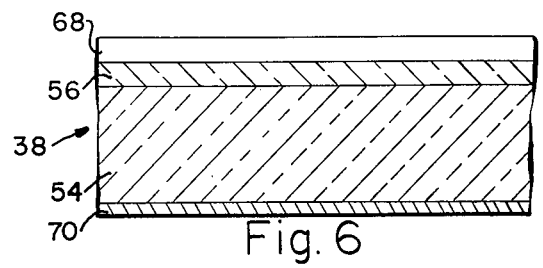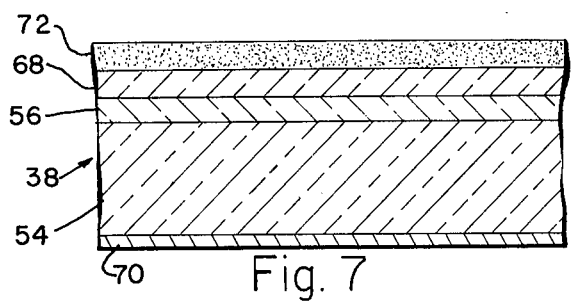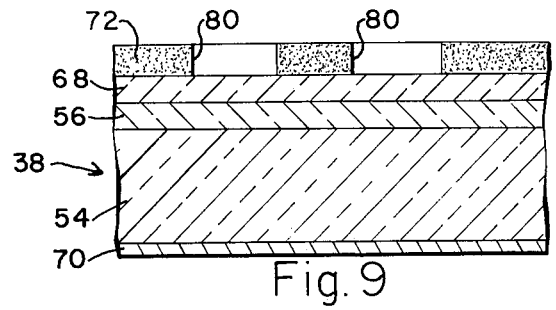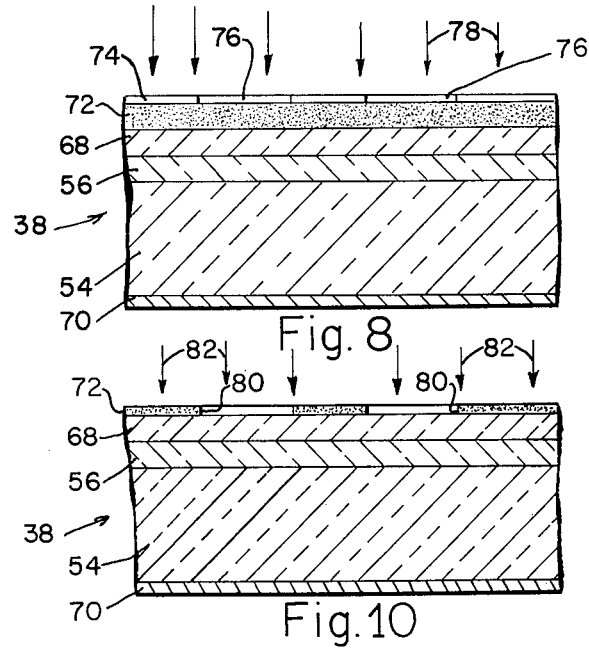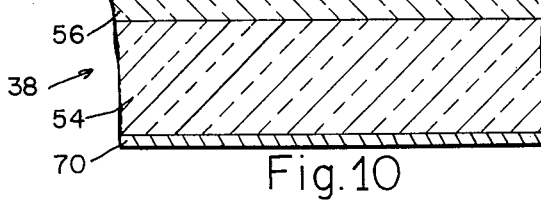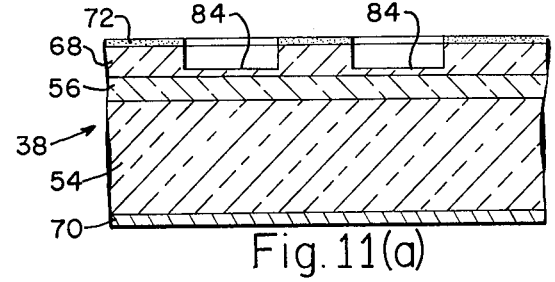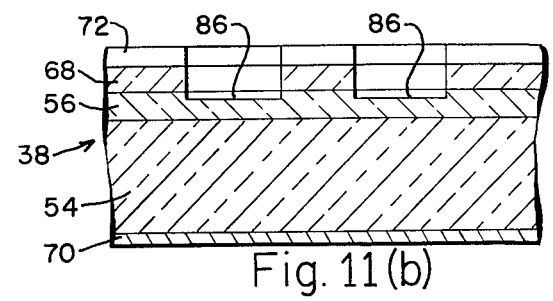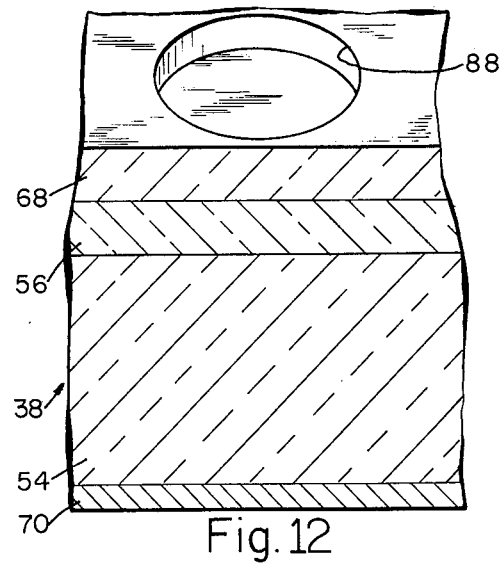

ION BEAM MICROMACHINING METHOD

The invention herein described was made in the course of or under a contract or subcontract thereunder, with the Department of The Air Force.

This is a continuation of application Ser. No. 272,518 filed July 17, 1972, now abandoned.

BACKGROUND OF THE INVENTION

1. Field of the Invention

The present invention relates to a method for fabricating millimeter wave devices and, in particular, to such a method utilizing ion beam micromachining techniques.

2. DESCRIPTION OF THE PRIOR ART

In the prior art, insulating material from semiconductor devices is generally removed by means of chemical etching processes, for example, for purposes of producing lead through vias through the insulating material to the underlying device layer. Such processes produce irregular edges in the vias which, when leads are deposited therein, result in poor electrical performance and variation in performance from device to device, especially as the device size is reduced to 2 micrometers and smaller. One reason for this problem is that, as the frequency of electronic devices extends to the millimeter-wave range (1 GHz to 100 GHz and above), the performance characteristics of the devices are strongly influenced by the capacitive and resistive effects which are related to the device geometry, i.e., the device size, pattern sharpness, and film thickness of layers involved. For example, a Schottky barrier diode operates effectively at millimeter-wave frequencies. The diode configuration was first described by Kahng and Lepselter in Bell System Technical Journal, 44, 1525 et seq. (1965) and an improved design was described by Young and Irvin in the Proceedings IEEE 53, 2130–2131 (1965) in an article entitled "Millimeter Frequency Conversion Using N-type GaAs Schottky-Barrier Epitaxial Diodes with a Novel Contacing Technique". This configuration consists of small, well-defined metal contacts on an epitaxial semiconductor surface and a contact at the back or bottom of the device. A structure of insulating material, such as silicon dioxide, is provided over the semiconductor to define the device geometry, to stabilize the semiconductor surface, and to ensure that a sharpened wire securely connects one, and only one, contact pad on the surface.

When either the pattern edges for such metallic contact pad or the thickness of the epitaxial layer is imprecise, parasitic impedances arise and degrade the performance and operating frequencies of the diode. These impedances are identifiable as the shunt susceptance due to junction capacitance and the series and junction resistance due to the undepleted epitaxial material. The effect of the junction capacitance is to cause the high-frequency signal to bypass the junction resistance, which results in loss in rectified signal. Similarly, the series resistance degrades the output and includes the combination of the resistance of the undepleted material in the epitaxial layer, the spreading resistance of the substrate material due to the comparative physical sizes of the diode and the back contact, and the back contact resistance.

The depletion layer or junction capacitance arises from the space-charge associated with the potential barrier of the junction. It can be minimized by decreasing the size of the contact area and using a lightly doped epitaxial layer. Since it is dependent on the effective barrier potential, it is also a function of the electrical biasing.

The junction resistance of the diode, often called the barrier resistance, arises from the existence of a barrier potential which restricts the passage of current carriers.

The resistance due to the undepleted region of the epitaxial layer is considered to be the largest series resistance, primarily because of the small cross-sectional area involved and the higher resistivity of the epitaxial layer. For optimum operation, no undepleted material is desired; however, this situation is, in practice, difficult to attain. When the diode is normally forward biased, some of the depletion layer is exposed, that is, a portion of the formerly non-conductive layer becomes conductive, the remaining portion significantly contributing to the series resistance. If the epitaxial layer is sufficiently thin to be the same thickness as or less than that of the depletion region at the quiescent biasing point, the series resistance resulting from the undepleted region would be minimized. Therefore, it is desirable to have a very thin epitaxial layer with the highest conductivity possible, while taking into consideration the depletion layer capacitance.

The spreading resistance of the substrate material is determined by the resistivity of the substrate and the diameter of the junction. The resistivity of the substrate can be specified to be a very low value, and techniques such as thinning by mechanical lapping can decrease the path length of material contributing to the resistance.

In the above example relating to the Schottky barrier diode, the fabrication of such a device included two operations of thinning the epitaxial layer and the production of holes through an insulating layer for purposes of making connection to a contact pad. As stated above, both thinning and production of holes has been conventionally performed by chemical etching processes. The success of etching metallic or other films is dependent upon the elimination of undercutting in order to avoid parasitic leakage and to maintain sharply defined lines below the masking patterns. Chemical etchings produce serious undercutting problems and/or ragged edges because control of the etch rate is poor. Undercutting results in several problems, such as variable resistance, exposure of junctions and of device components otherwise intended to be protected, non-uniform capacitance, and discontinuity of deposition of material over the device. Ragged edges result in uneven capacitance and resistance and discontinuity of material deposition.

In prior art processes, plasma sputtering techniques are utilized; however, because the wafer is placed in the plasma, the plasma etching characteristics cannot be controlled with the precision required. Also, the plasma can cause undesired polymerization of the masking resist on a substrate layer, to make later removal difficult, if not impossible, without damage.

SUMMARY OF THE INVENTION

The present invention overcomes these and other problems by providing a precise and controllable means for etching an entire surface, or portions thereof, and a means for etching accurately dimensioned holes in a substrate layer by machining the substrate layer with an ion beam. Furthermore, the substrate layer itself or other layers may be deposited by use of the same ion beam through a sputtering deposition process, simply by redirecting the ion beam from the substrate to a sputtering target for ejecting material onto the opposing substrate. Since the use of ion beam machining operates in a pressure of $10^{-5}$ Torr or lower, there is little likelihood that the substrate, doped portions therein, or layers thereon are harmed, such as often occurs in conventional plasma sputtering processes.

It is, therefore, an object of the present invention to provide an improved method for fabrication of semiconductor devices.

Another object is the provision of such a method for providing precise control in thinning layers on substrates.

Another object is to provide such a method for producing accurately made holes or patterns in layers on a substrate.

Other aims and objects, as well as a more complete understanding of the present invention, will appear from the following explanation of exemplary embodiments and the accompanying drawings thereof.

BRIEF DESCRIPTION OF THE DRAWINGS

FIGS. 3–11 respectively depict the successive processing steps of the present invention, FIGS. 11(a) and 11(b) showing alternate end processing steps; and FIG. 12 is a pictorial representation of an actual hole micromachined through a silicon dioxide layer.

DESCRIPTION OF THE PREFERRED EMBODIMENTS

Figure 1:
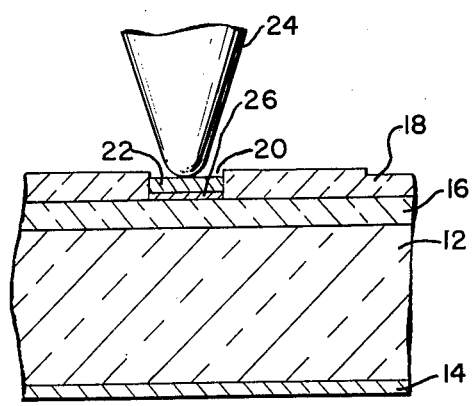
FIG. 1 is a cross-sectional view of an illustrative Schottky barrier diode useful in explaining the prior art and the advantages of the present invention.

Accordingly, FIG. 1 illustrates a cross-sectional sketch of a millimeter wave Schottky barrier diode comprising an N$^+$ substrate 12, such as gallium arsenide or silicon, a bimetal contact 14 secured to the lower part of the substrate, an epitaxial layer 16, such as of N-type GaAs or silicon, and an insulating layer 18, such as silicon dioxide, silicon nitride, or aluminum oxide. Disposed in one or more portions of the insulating layer is a hole 20 with a gold pad 22, intended for contact with epitaxial layer 16, and a gold contact wire 24. A barrier metal 26 is usually placed between pad 22 and epitaxial layer 16, to establish the desired operation characteristics of the diode.

Figure 2:
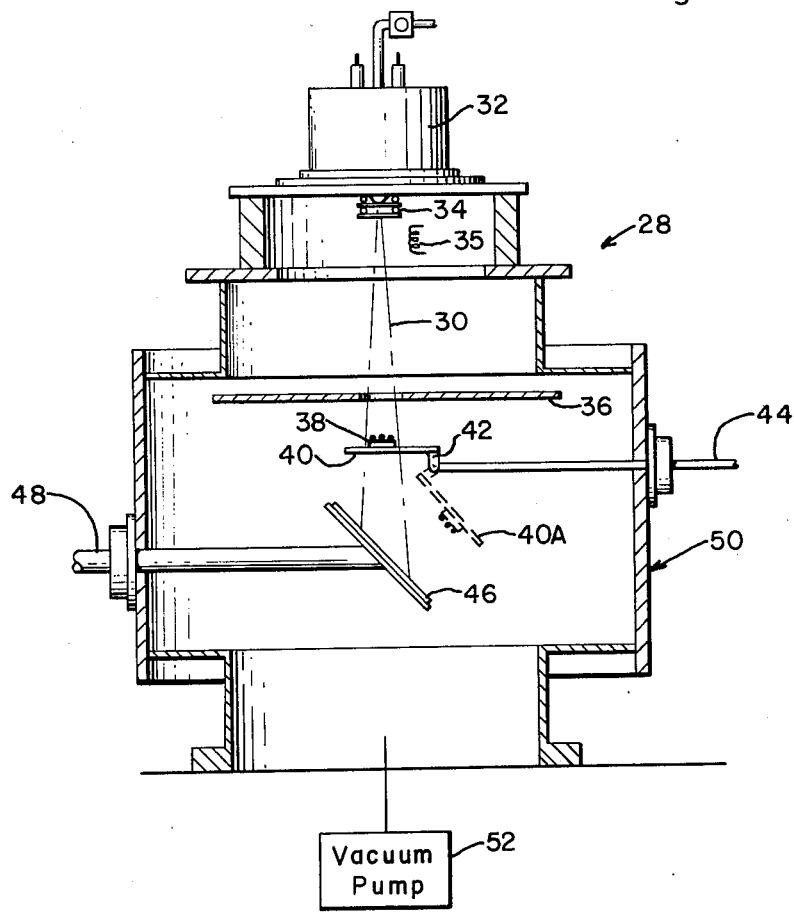
FIG. 2 is a schematic view of an ion beam sputtering and micromachining system used in the method of the present invention.

In the process of the present invention, reference is first made to the apparatus depicted in FIG. 2 which schematically illustrates an ion beam machining and sputtering system 28. An ion beam 30 is produced by an ion source 32, such as a duoplasmatron or Penning discharge source. The beam produced by source 32 is directed through a beam shaping device 34, passes by a source 35 of neutralizing electrons, and passes through an aperture 36 which limits the expansion of the beam so that it will fall upon a specimen or substrate 38. The electrons from source 35 are used to prevent a buildup of surface charges on insulating targets or substrates which otherwise would inhibit sputtering thereon. Thus, the system is capable of sputtering conductors as well as non-conductors by means of a direct current ion beam. The specimen is mounted on a hinged holder 40 which is pivoted at pivot 42 so that it may take the position as shown in full lines in the path of ion beam 30 or be pivoted away to the position of dashed lines 40A for a sputtering deposition operation. A shaft 44 extends outside of the system to provide this pivoting operation.

Below the specimen and its holder is an interchangeable sputtering target 46 which is supported within system 28 by a rod 48. The system includes an enclosure 50 which is sealed and capable of evacuation by a vacuum pump 52. Use of system 28 will become apparent when taken in conjunction with the following description of the preferred embodiment of the invention.

The specimen, such as a substrate of gallium arsenide or silicon, doped in such a manner to product N$^+$ profile, is mounted on holder 40. The substrate may be obtained commercially and must be of high quality. It further may have an epitaxial layer thereon which is uniform over the substrate wafer. Alternately, the epitaxial layer may be grown by a vapor phase epitaxial process, such as disclosed in "Thin Film Phenomena," by K. L. Chopra, McGraw-Hill Book Co., 1969. In either case, the epitaxial layer must be of an even and constant thickness. The epitaxial layer also should have donor impurity concentrations of 3.3 to $8.8 \times 10^{16}/cm^3$.

Such a specimen 38 is depicted in FIG. 3, comprising a substrate 54 of N$^+$ donor impurity and an epitaxial N-layer 56 thereon. The wafer with epitaxial layer is cleansed in suitable solvents and rinsed in deionized water to remove possible surface contaminants.

If the epitaxial layer is not of the desired, uniform thickness, it is subjected to ion beam micromachining techniques, as depicted in FIGS. 3–5.

This thinning of the epitaxial layer, such as by means of the ion beam micromachining technique of the present invention, is necessary to control the physical dimensions of the device to be grown, which results from difficulties of prior processes in initially growing thin epitaxial layers. As previously described, as the thickness of the epitaxial layer increases, the effective series resistance due to the conduction path through undepleted material also increases.

The initial impurity profile of epitaxial material may be specified by the supplier or measured by use of the automatic profile plotter as described by B. J. Gordon, H. L. Stover, and R. S. Harp, in "A New Automaic Impurity Profiler for Epitaxy and Devices," reported in the Proceedings of Symposium on Silicon Devices Processing, Gaithersburg, Maryland, May 1970. For the illustrative device, the Schottky barrier diode, an epitaxial thickness of b 0.2 to 0.1 micrometers is desired.

As shown in FIG. 3, wafer or specimen 38, comprising substrate 54 and epitaxial layer 56, is placed in a high vacuum sputtering system, such as depicted in FIG. 2. A metallic tab 58 is placed over at least one edge of the wafer to retain the wafer in place on holder 40 and acts as a shield against sputtering during the subsequent processing. The system is pumped down to a vacuum of approximately $1 \times 10^{-7}$ Torr. Pressure rises to about $1 \times 10^{-5}$ Torr with argon subsequently admitted through the ion source. An ion beam, for example, argon or other inert gas, as represented by arrows 60, is directed at the epitaxial layer at typical energies of 3 keV and intensities of 0.1 mA/cm$^2$ to permit removal of the epitaxial surface layer at a rate of about 50 A per minute. Because sputtering is accomplished by an atom-by-atom removal process, the etching is uniform and accurately controllable. Following removal of a part of the layer to the desired thickness, the wafer is removed from the system and the amount of the material which was removed is verified by optical interferometric or profilometric measurement of the step height produced at the edge of masking tab 58, as shown in FIG. 4, by the original height 62 versus the micromachined height 64. If removal of additional material is required, wafer 38 is reinserted into the system with tab 58 repositioned thereon but in a slightly different position, as shown in FIG. 5, so that after further micromachining machining a measurement may again be made referring to the original unmachined surface at height 62 in comparison with the first machined height 64 and the final machined height 66. By such micromachining processing, epitaxial layer 56 can be reduced to a precise, even thickness.

Since some materials are damaged by the ion bombardment of argon beam 60, this damage can be removed by one of several processes. First, during the last micromachining step, the bombardment energy can be gradually decresed until the final ion penetration and damage depth is reduced to zero. Secondly, the wafer, as machined, may be heated in situ to anneal out the damage. Thirdly, a very gentle chemical etch may be used to remove the damaged surface layers. This third approach was found to work most satisfactorily for the illustrative Schottky barrier diodes.

After the desired epitaxial layer of thickness has been established, an isolating layer, e.g., $SiO_2$, $Si_3N_4$, or $Al_2O_3$, is deposited on the surface, as shown in FIG. 6 and in the system such as depicted in FIG. 2. One of several known processing steps may be utilized, such as by ion beam sputtering deposition from an opposing target of insulative material or by gaseous reaction deposition. For a Schottky barrier diode, a film thickness of 3,000 A to 5,000 A is desired so that sufficiently deep contact holes in the insulating oxide layer may be provided with sharply defined metallized contact edges, thus allowing each sharpened lead-in wire to enter and remain in contact with each discrete contact pad.

The silicon dioxide deposition step by gaseous reaction may be obtained as described by Chopra's above-identified text, "Thin Film Phenomena".

For ion beam sputtering deposition, shaft 44 is manipulated to position the holder for wafer 38 in position 40A so that the wafer now faces sputtering target 46. This step proceeds by utilizing an argon ion beam at approximately 7.5 keV energy and 0.1–0.3 $mA/cm^2$ intensity in an environment of $1 \times 10^{-5}$ Torr. A period of approximately one hour processing obtains the 3,000 A to 5,000 A deposition, resulting in the device depicted in FIG. 6 with substrate 54, epitaxial layer 56, silicon dioxide layer 68, and a bimetallic contact 70.

Processing for providing contact holes in the structure is accomplished by combined use of photosensitive resist masking procedures combined with ion beam micromachining procedures, as shown in FIGS. 7 to 11(a)–(b), the latter two figures illustrating different end results desired.

As shown in FIG. 7, a film 72 of photosensitive resist material is spun onto the surface of the insulative layer. The photosensitive resist material may be of any commercially obtainable material such as KPR, trademark of Eastman Kodak Company, a negative resist, or "Shipley 1350", a trademark of Shipley Company, a positive photoresist. Application of these materials is made according to the instructions by the manufacturers. Atop photoresist material 72, as shown in FIG. 8, is placed a mask pattern 74 having darkened areas 76, for example when used with a negative resist, for prevention of exposure of the photoresist material lying beneath the darkened mask areas. Upon exposure to ultraviolet light, as represented by arrows 78, all portions of photoresist 72 are exposed, excepting those lying beneath darkened areas 76. Mask 74 is then removed and those unexposed portions of resist 72 underlying darkened areas 76 are removed to produce a resist mask having apertures 80 therein, as shown in FIG. 9. For a positive resist, the darkened and lightened areas of the mask are reversed.

This masked wafer is then placed into the system such as shown in FIG. 2, and processed as depicted in FIG. 10 wherein arrows 82 depict a broadly focused ion beam, such as of argon ions. The ion beam is broadly focused so that the ions enter apertures 80 perpendicularly to micromachine sharply and evenly through layer 68. Ion energies of 3 to 5 keV at an intensity of 0.1 $mA/cm^2$ is provided in a vacuum of $1 \times 10^{-5}$ Torr, which provides a removal rate of silicon dioxide of approximately 50 A per minute. Monitoring of the process may be performed by visually observing the change in color of the oxide film in an unmasked test area of the wafer set aside for this purpose. Machining may continue to approximately a 500 A thickness, as shown in FIG. 11(a), or into the epitaxial layer, as shown in FIG. 11(b). The extent to which this ion beam micromachining is allowed to etch through the oxide depends upon the particular device characteristics desired. When the approach to the epitaxial layer must be very gentle, so as to cause no ion bombardment damage to the semiconductor, the ion etching is stopped when the oxide film has been reduced to approximately 500 A. A buffered and chilled chemical etchent, e.g., hydrogen fluoric acid, is then used to remove the remaining thin oxide film. Because the majority of the etching has been done with the ion beam, the edge definition is well established and the final brief chemical etch is insufficient to cause undercutting or enlargement of the pattern dimensions.

As shown in FIG. 11(b), where a slight recess into the semiconductor is desired to alter the electric field lines at the interface between the insulator and the semiconductor, the ion beam is permitted to etch completely through the insulator film and into the epitaxial layer to the desired depth, such as depth 86. In either case, a very light chemical polish of the semiconductor surface is used to remove a very thin layer of the semiconductor prior to metallization of the contact pad 26 (FIG. 1) by either electro-deposit or vapor deposition.

Following metallization of the contact pads, the photoresist film is removed from the surface and the wafer may be diced into chips of a convenient size for mounting or be utilized as processed for large scale integration purposes.

The devices, as fabricated by the above-described processes in GaAs and silicon, have demonstrated conversion loss performance exceeding prior art techniques. In GaAs these devices have exhibited conversion loss at 60 GHz of only 3.0 dB and 3.5 dB in silicon as compared with 5.5dB and 6.5 dB in silicon. A large part of this improved performance is a result of the sharply defined micromachined holes, one of which is shown in FIG. 12 as hole 88. This FIG. 12 is a drawing taken from an actual device micromachined by use of the present invention and clearly shows the sharpness of the edges.

Although the invention has been described with reference to particular embodiments thereof, it should be realized that various changes and modifications may be made therein without departing from the spirit and scope of the invention.

What is claimed is:

1. A method for producing sharp-edged holes in electronic devices comprising the steps of:

holding a specimen with an epitaxial layer thereon in position by a tab placed over a portion of the specimen and the epitaxial layer;

directing an ion beam over the specimen and the epitaxial layer while shielding the portion of the epitaxial layer covered by the tab from the ion beam for machining exposed portions of the epitaxial layer and for thinning the epitaxial layer to a specified thickness;

measuring the amount of exposed epitaxial layer portions against the shielded epitaxial portion by means for determining the depth of the specimen portions machined by said directing step;

placing a mask substantially in contact on and with the thinned specimen, the mask having means therein for enabling subsequent production of the sharp-edged holes in the specimen; and directing an ion beam at the specimen and the mask and through the mask means for removing portions of the specimen unprotected by the mask means by ions from the beam and thereby for producing the sharp-edged holes in the specimen.

2. A method as in claim 1 wherein said ion beam directing step comprises the step of broadly processing the ion beam over the entire specimen and mask.

3. A method of thinning a specimen with a surface layer thereon to a specified thickness comprising the step of:

holding the specimen with the surface layer in position by a tab placed over a portion of the surface layer;

directing an ion beam over the surface layer for uniformly removing portions thereof while shielding the portion by the tab from the ion beam; and measuring the amount of the surface layer remaining after said ion beam directing step against the amount of the surface layer portion covered by the tab by means for determining the depth of the surface layer removed by said directing step.

* * * * *